US006217340B1

(12) United States Patent
Gordon

(10) Patent No.: US 6,217,340 B1
(45) Date of Patent: Apr. 17, 2001

(54) ELECTRICAL CONNECTOR ASSEMBLY

(75) Inventor: Gary G. Gordon, Novi, MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/512,583

(22) Filed: Feb. 24, 2000

(51) Int. Cl.$^7$ ................................ H05K 1/00; H01R 9/09
(52) U.S. Cl. ................................ 439/57; 439/548
(58) Field of Search ................................ 439/56, 57, 547, 439/546, 548, 558, 559

(56) References Cited

U.S. PATENT DOCUMENTS

| | | | |
|---|---|---|---|
| 2,884,609 * | 4/1959 | Fraser | 439/57 |
| 3,798,588 * | 3/1974 | Howe et al. | 439/547 |
| 4,193,653 | 3/1980 | Aizawa . | |
| 5,061,189 | 10/1991 | Iio et al. . | |
| 5,800,183 | 9/1998 | Paul et al. . | |

* cited by examiner

*Primary Examiner*—Neil Abrams
*Assistant Examiner*—Phuong Dinh

(74) *Attorney, Agent, or Firm*—Tarolli, Sundheim, Covell, Tummino & Szabo L.L.P.

(57) ABSTRACT

A connector assembly 40 mounts a light bulb 20 to a fixture 22. The fixture 22 has an interior surface 24, an exterior surface 26, and an opening 28. The opening 28 defines a peripheral surface interconnecting the interior and exterior surfaces 24, 26. The connector assembly 40 includes a housing 42, at least one tab 44, and a flange 48. The housing 42 supports the light bulb 20 and has an axis 50, a first portion 52, and a second portion 54 spaced axially from the first portion 52. The tab 44 extends radially from the first portion 52 of the housing 42 and includes a first pair of electrical contacts 60, 62 for engaging a second corresponding pair of electrical contacts 30, 32 on the interior surface 24 of the fixture 22 as the first portion 52 of the housing 42 is axially inserted through the opening 28 in the fixture 22 and rotated about the axis 50 of the housing 42. The flange 48 extends radially from the second portion 54 of the housing 42 and has a seal 80 for axially engaging the exterior surface 26 of the fixture 22 as the first portion 52 of the housing 42 is inserted through the opening 28 in the fixture 28.

12 Claims, 2 Drawing Sheets

ELECTRICAL CONNECTOR ASSEMBLY

TECHNICAL FIELD

The present invention relates to a connector assembly for an electric light bulb, and more specifically, to a connector assembly for mounting a taillight to a vehicle.

BACKGROUND OF THE INVENTION

A conventional connector assembly mounts a light bulb to a vehicle taillight lens. The vehicle taillight lens and the connector assembly are designed to withstand environmental conditions. The taillight lens is handled significantly during assembly to the vehicle, and the taillight lens must withstand moisture and contaminants to maintain the light bulb in operating condition once the taillight lens is installed in the vehicle.

Known assemblies do not adequately meet the above requirements. In known assemblies a wire harness, exterior to the taillight lens, provides power to the connector assembly and the light bulb. The use of the harness results in some mechanical failures during handling and exposure to moisture and contaminants. The present invention provides an inexpensive connector assembly which can be easily handled and provide a reliable barrier to these external factors such as moisture and contaminants.

SUMMARY OF THE INVENTION

The present invention relates to a connector assembly for mounting a light bulb to a fixture. The fixture has an interior surface, an exterior surface, and an opening. The opening defines a peripheral surface interconnecting the interior and exterior surfaces.

The connector assembly includes a housing for supporting the light bulb, at least one tab, and a flange. The housing has an axis, a first portion, and a second portion spaced axially from the first portion. The tab extends radially from the first portion of the housing and includes at least a first pair of electrical contacts for engaging at least a second corresponding pair of electrical contacts on the interior surface of the fixture when the first portion of the housing is axially inserted through the opening in the fixture and rotated about the axis of the housing. The flange extends radially from the second portion of the housing and has a seal for axially engaging the exterior surface of the fixture as the first portion of the housing is inserted through the opening in the fixture.

BRIEF DESCRIPTION OF THE DRAWINGS

The foregoing and other features of the invention will become more apparent to one skilled in the art upon consideration of the following description of the invention and the accompanying drawings wherein.

DESCRIPTION OF PREFERRED EMBODIMENTS

According to the present invention, as seen in FIGS. 1–4, a connector assembly 40 mounts, both mechanically and electrically, a wedge base lamp (light bulb) 20 to a taillight lens (fixture) 22 of a vehicle.

Figure 1:
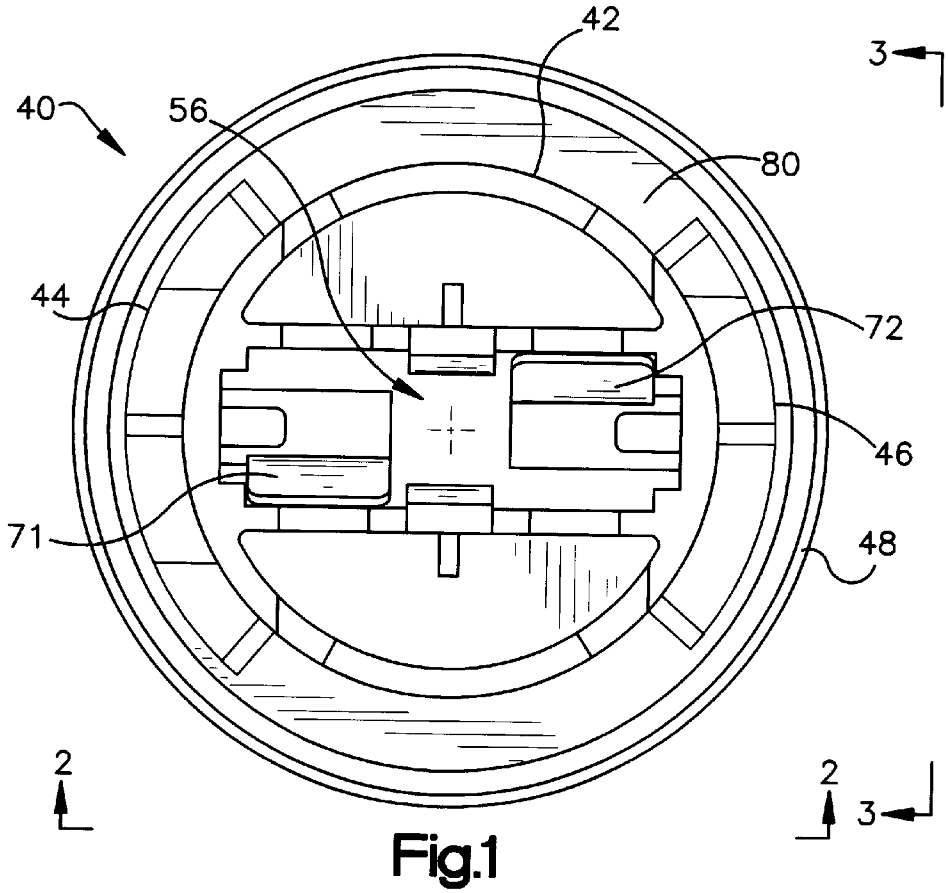
FIG. 1 is a schematic view of a connector assembly embodying the present invention.
Figure 2:
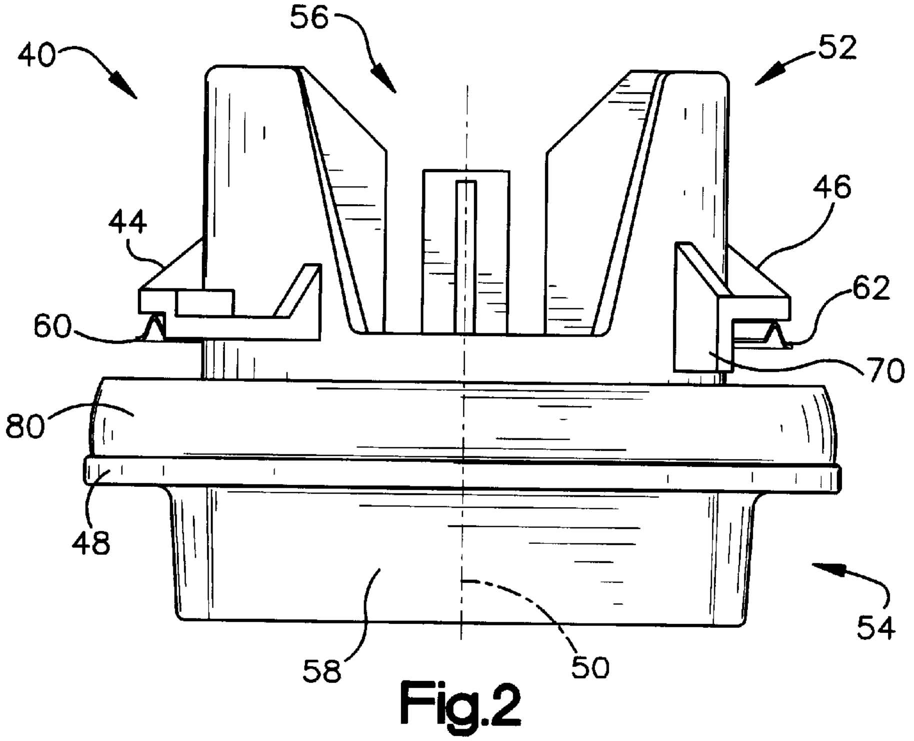
FIG. 2 is a view taken along line 2—2 of FIG. 1.
Figure 3:
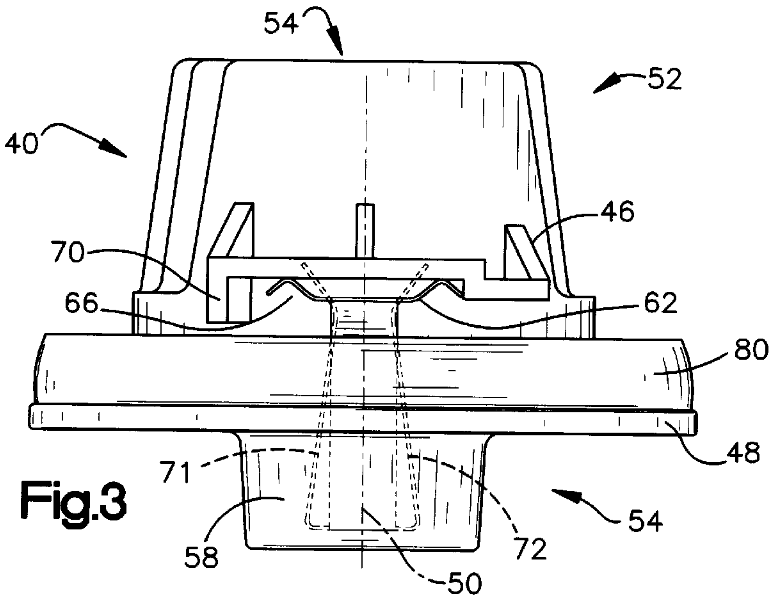
FIG. 3 is a view taken along line 3—3 of FIG. 1.
Figure 4:
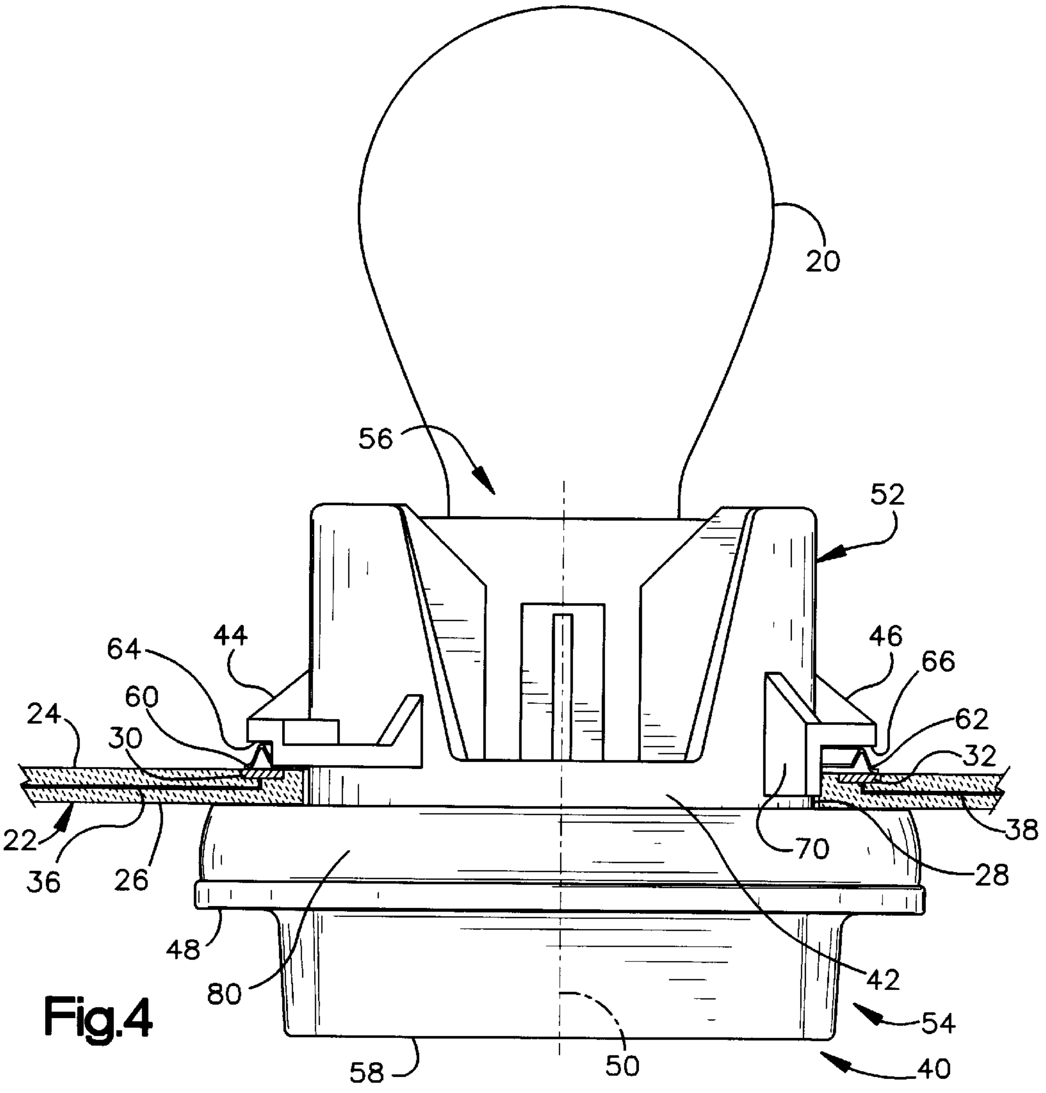
FIG. 4 is a schematic view of the assembly of FIG. 1 mounting a light bulb to a fixture.

As viewed in FIG. 4, the fixture 22 has an interior surface 24, an exterior surface 26, and an opening 28. The opening 28 defines a peripheral surface interconnecting the interior and exterior surfaces 24, 26.

The connector assembly 40 includes a cylindrical housing 42, a first arc-like tab 44, a second smaller arc-like tab 46, and a circular flange 48. The housing 42 supports the light bulb 20 on the fixture 22. The housing 42 has an axis 50, a first portion 52, and a second portion 54 spaced axially from the first portion 52. The first and second portions 52, 54 are centered on the axis 50. The housing 42 further includes a socket 56 and a base, or knob 58. The socket 56 receives the light bulb 20. The knob 58 provides a handle for the connector assembly 40 which handle is manipulated during installation onto the fixture 22.

The first and second tabs 44, 46 extend radially from the first portion 52 of the housing 42 and circumferentially around the housing 52. The tab 46 extends a shorter distance circumferentially around the housing 42 than the tab 44. The tabs 44, 46 are spaced apart at diametrically opposed positions around the axis 50 of the housing 42. Each of the first and second tabs 44, 46 is associated with one of a first pair of metal electrical contacts 60, 62 for engaging a second corresponding pair of metal electrical contacts 30, 32 molded into the interior surface 24 of the fixture 22 (FIG. 4). The contacts 60, 62 are located beneath the tabs 44, 46, respectively, as shown in FIG. 4.

The connector assembly 40 is installed on the fixture 22 by axially inserting the first portion 52 of the housing 42 through the opening 28 in the fixture 22 and rotating the connector assembly 40 about the axis 50 of the housing 42. The knob 58 on the housing 42 is manually gripped to manipulate the connector assembly 40 during this operation.

The first pair of electrical contacts 60, 62 electrically connect with contacts 71, 72 within the socket 56 of the connector assembly 40 and transfer power from the first pair of contacts 60, 62 to the contacts 71, 72 and corresponding contacts (not shown) on the light bulb 20. The second pair of electrical contacts 30, 32 on the fixture 22 engage power conduits 36, 38 embedded within the fixture 22. The power conduits 36, 38 are connected to a power source, such as a vehicle battery or a vehicle alternator. Through these connections, power is transferred to the light bulb 20.

Each of the first pair of the electrical contacts 60, 62 associated with the first and second tabs 44, 46 is received in first and second recessed portions 64, 66 on the first and second tabs 44, 46, respectively. A projection 70 is located adjacent the second tab 46. This projection 70 limits the rotation of the housing 42 about the axis 50 after the first portion 52 of the housing 42 is inserted through the opening 28 of the fixture 22. The projection 70 determines a stopping point for rotation of the housing 42 by abutting a portion of the fixture 22.

The flange 48 extends radially from the second portion 54 of the housing 42 and supports a seal ring 80 which is concentric about the axis 50 of the housing 42. The seal ring 80 engages the exterior surface 26 of the fixture 22 and is compressed as the first portion 52 of the housing 42 is inserted through the opening 28 in the fixture 22. Together, the tabs 44, 46 and the flange 48 secure the contacts 30, 32, 60, 62, the fixture 22, and the seal ring 80 between them, as seen in FIG. 4. The seal ring 80 blocks moisture and contaminants from reaching any of the electrical contacts 30, 32, 60, 62 and the interior of the fixture 22.

The opening 28 of the fixture 22 includes a circular portion through which the housing 42 is inserted and two arcuate slots (not shown) which communicate with the circular portion. The slots correspond in size and shape to the first and second tabs 44, 46 (i.e., one slot sized to receive the first tab 44 and one slot sized to receive the smaller second tab 46). As the housing 42 is inserted through the opening 28, each tab 44, 46 travels axially through its corresponding slot. As the housing 42 is then rotated about its axis 50, the tabs 44, 46 move angularly about the axis 50 of the housing 42, slide along the interior surface 24 of the fixture 22, and block axial movement of the housing 42 back through the opening 28. The projection 70 blocks rotation farther than the edge of the second tab 46 by abutting a side of the smaller of the two slots of the opening 28.

The first pair of electrical contacts 60, 62 of the tabs 44, 46 and the seal ring 80 face in parallel opposite directions toward each other. The engagement of the flange 48 with the exterior surface 26 of the fixture 22 secures the first pair of electrical contacts 60, 62 of the tabs 44, 46 against the second pair of electrical contacts 30, 32 of the interior surface 24 of the fixture 22. The engagement of the tabs 44, 46 with the interior surface 24 of the fixture 22 secures the seal ring 80 of the flange 48 against the exterior surface 26 of the fixture 22.

The resilience of the seal ring 80 typically maintains a tight axial pressure fit between the tabs 44, 46, the first pair of electrical contacts 60, 62, the second pair of electrical contacts 30, 32, the fixture 22, the seal ring 80, and the flange 48 because the flange 48 depresses the seal ring 80 against the exterior surface 26 of the fixture 22. If the assembly is made of a flexible material, such as a polymer, the tabs 44, 46 and flange 28 may be fitted such that the tabs 44, 46 form flexure springs which are deflected axially when the tabs 44, 46 engage the fixture 22 and utilize friction between the tabs 44, 46 and the fixture 22 to further maintain the tight fit.

The housing 42 further includes two axially projecting support arms 141, 142. The support arms 141, 142 are flexible cantilevers extending upward away from the base of the socket 56 (as viewed in FIG. 2). The support arms 141, 142 spring apart when the light bulb 20 is inserted into the socket 56 and spring back when the light bulb 20 is in its installed position, thereby securing the light bulb 20 in the socket 56.

The housing 42 may be constructed of several parts which are assembled in order to enclose the connections of the electrical contacts 60, 62, 70, 72. Mechanical snap construction or sonic welding are typical assembly methods if several parts are assembled together.

From the above description of the invention, those skilled in the art will perceive improvements, changes and modifications. For example, for a dual filament light bulb 20 three electrical contacts and three tabs would be required instead of the two electrical contacts 60, 62 and two tabs as disclosed in the drawings. Such improvements, changes and modifications within the normal skill of the art are intended to be included within the scope of the appended claims.

Having described the invention, the following is claimed:

1. A connector assembly for mounting a light bulb to a fixture, the fixture having an interior surface, an exterior surface, and an opening, the opening defining a peripheral surface interconnecting the interior and exterior surfaces, said connector assembly comprising:

a housing for supporting the light bulb, said housing having an axis, a first portion, and a second portion spaced axially from said first portion, said housing including at least a first pair of electrical contacts for engaging at least a second corresponding pair of electrical contacts on the interior surface of the fixture as said first portion of said housing is axially inserted through the opening in the fixture and rotated about said axis of said housing, said housing further including at least one tab extending radially from said first portion of said housing, said tab including at least one of said first pair of electrical contacts;

a flange extending radially from said second portion of said housing; and a resilient seal ring for engaging said flange and for engaging the exterior surface of the fixture, said resilient seal ring being compressed between said flange and the exterior surface as said first portion of said housing is axially inserted through the opening in the fixture.

2. The connector assembly as defined in claim 1 wherein said first pair of electrical contacts of said housing and said seal ring form opposing surfaces facing each other, at least part of both said first pair of electrical contacts and said seal ring lying an equal radial distance from said axis.

3. The connector assembly as defined in claim 2 wherein said flange secures said first pair of electrical contacts of said housing against the second pair of electrical contacts of the interior surface of the fixture.

4. The connector assembly as defined in claim 2 wherein said tab secures said seal ring against the exterior surface of the fixture.

5. The connector assembly as defined in claim 1 wherein said at least one tab comprises a first tab and a second tab, said first tab being spaced apart from said second tab, said first and second tabs extending at diametrically opposed positions around said axis of said housing, said first tab being circumferentially smaller than said second tab.

6. The connector assembly as defined in claim 1 wherein said housing includes a socket for receiving the light bulb.

7. The connector assembly as defined in claim 1 further including at least one projection for limiting the rotation of said housing about said axis after said first portion of said housing is inserted through the opening of the fixture.

8. The connector assembly as defined in claim 7 wherein said at least one projection is located adjacent said at least one tab.

9. The connector assembly as defined in claim 1 wherein said seal ring is located concentrically about said axis of said housing.

10. The connector assembly as defined in claim 1 wherein said tab has a recessed portion for receiving at least one of said first pair of electrical contacts.

11. A connector assembly for mounting a light bulb to a fixture, the fixture having an interior surface, an exterior surface, and an opening, the opening defining a peripheral surface interconnecting the interior and exterior surfaces, said connector assembly comprising:

a housing for supporting the light bulb, said housing having an axis, a first portion, and a second portion spaced axially from said first portion;

at least one tab extending radially from said first portion of said housing, said at least one tab including at least one of a first pair of electrical contacts for engaging at least one of a second corresponding pair of electrical contacts on the interior surface of the fixture as said first portion of said housing is axially inserted through the opening in the fixture and rotated about said axis of said housing; and a flange extending radially from said second portion of said housing, said flange having a seal for axially engaging the exterior surface of the fixture as said first portion of said housing is inserted through the opening in the fixture, said at least one tab comprising a first tab and a second tab, said first tab being spaced apart from said second tab, said first and second tabs extending at diametrically opposed positions around said axis of said housing, said first tab being circumferentially smaller than said second tab.

12. A connector assembly for mounting a light bulb to a fixture, the fixture having an interior surface, an exterior surface, and an opening, the opening defining a peripheral surface interconnecting the interior and exterior surfaces, said connector assembly comprising:

a housing for supporting the light bulb, said housing having an axis, a first portion, and a second portion spaced axially from said first portion;

at least one tab extending radially from said first portion of said housing, said at least one tab including at least one of a first pair of electrical contacts for engaging at least one of a second corresponding pair of electrical contacts on the interior surface of the fixture as said first portion of said housing is axially inserted through the opening in the fixture and rotated about said axis of said housing; and a flange extending radially from said second portion of said housing, said flange having a seal for axially engaging the exterior surface of the fixture as said first portion of said housing is inserted through the opening in the fixture, at least part of both said first pair of electrical contacts of said at least one tab and said seal of said flange lying an equal radial distance from said axis of said housing.

* * * * *